United States Patent [19]
Pendse et al.

[11] Patent Number: 5,920,200
[45] Date of Patent: Jul. 6, 1999

[54] APPARATUS AND METHOD FOR PRECISE ALIGNMENT OF A CERAMIC MODULE TO A TEST APPARATUS

[75] Inventors: Rajendra D. Pendse, Fremont, Calif.; Jaime L. Del Campo, Portland, Oreg.

[73] Assignee: Hewlett-Packard Company, Palo Alto, Calif.

[21] Appl. No.: 08/898,327

[22] Filed: Jul. 22, 1997

[51] Int. Cl.⁶ .................................................. G01R 1/04
[52] U.S. Cl. .......................................... 324/758; 324/755
[58] Field of Search .................................... 324/758, 755, 324/765; 439/70, 526

[56] References Cited

U.S. PATENT DOCUMENTS

| | | | |
|---|---|---|---|
| 4,329,642 | 5/1982 | Luthi et al. | 439/526 |
| 5,076,794 | 12/1991 | Ganthier | 439/70 |
| 5,556,808 | 9/1996 | Williams et al. | 324/758 |

*Primary Examiner*—Vinh P. Nguyen
*Assistant Examiner*—Minh Tang
*Attorney, Agent, or Firm*—Brian R. Short

[57] ABSTRACT

An apparatus and method for aligning the conductive pads of a ceramic module with contact points of a socket. The apparatus includes a ceramic module having a plurality of conductive pads. A plurality of rigid spheres are attached to some of the plurality of conductive pads. A socket having apertures and conductive test points receives the ceramic module. The apertures receive the rigid spheres of the ceramic module and align the conductive pads in registration with the plurality of conductive test points.

7 Claims, 2 Drawing Sheets

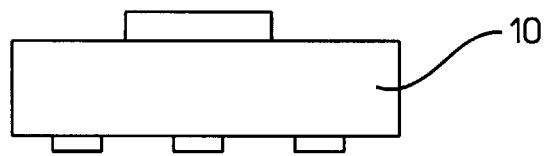
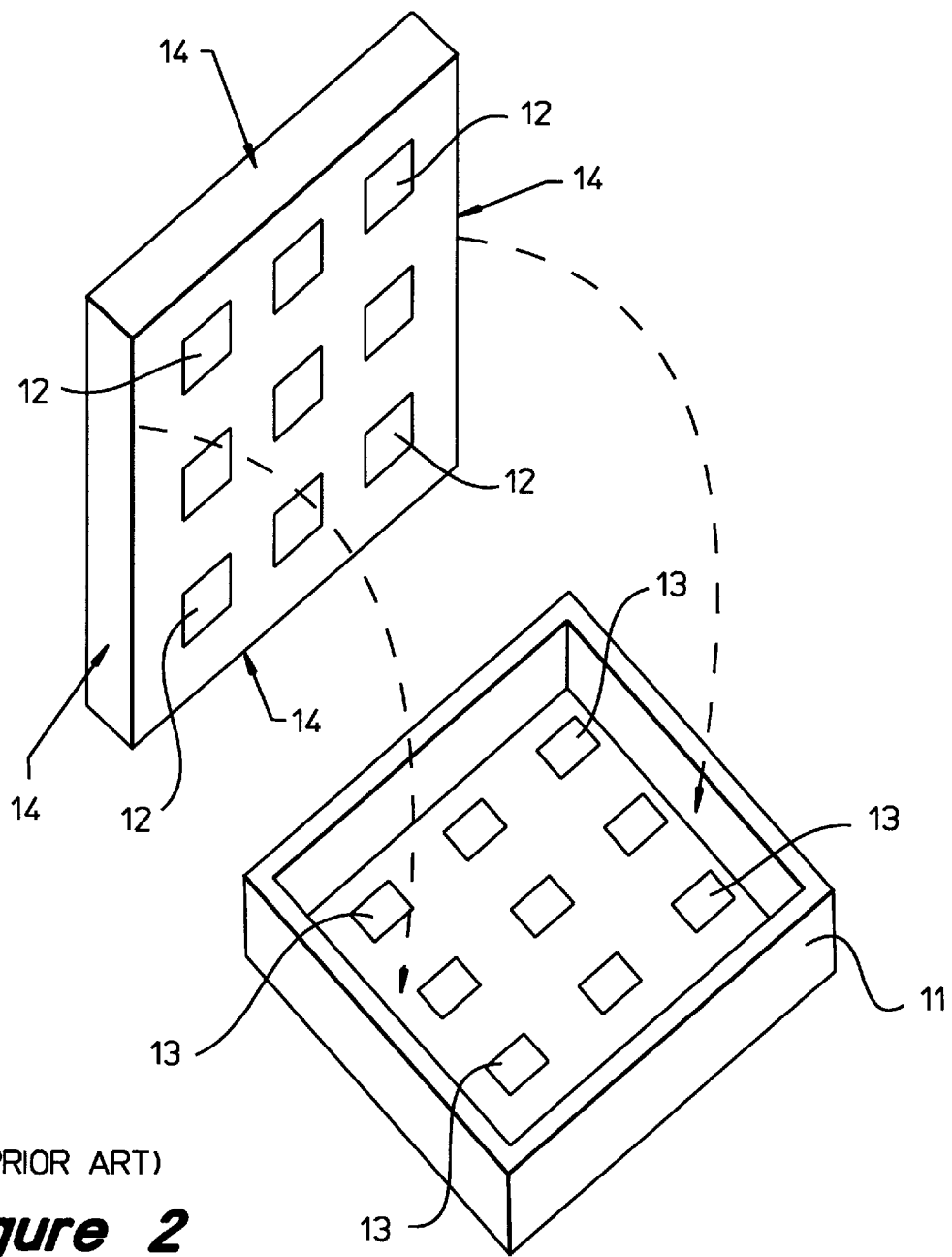

APPARATUS AND METHOD FOR PRECISE ALIGNMENT OF A CERAMIC MODULE TO A TEST APPARATUS

FIELD OF INVENTION

This invention relates generally to a method of aligning a ceramic module to a testing socket. In particular, it relates to forming metal spheres on conductive pads of the ceramic module and using the metal spheres to align input and output conductive pads on the ceramic module with conductive contacts of the testing socket.

BACKGROUND

Ceramic modules, such as single chip packages and multi-chip modules (MCMs), are typically mounted in sockets for electrical testing. The sockets include conductive contacts which electrically connect to conductive pads located on the ceramic modules. The sockets can also be used for interconnecting the ceramic module to a printed circuit board. In either case, the input and output conductive pads of the ceramic module must be accurately mated with the corresponding conductive contacts of the socket.

FIG. 1 and FIG. 2 show a ceramic module 10 and a socket 11. The ceramic module 10 includes conductive pads 12 which must make registration contact with conductive contacts 13 of the socket 11. Typically, this is done by using the physical edges 14 of the ceramic module 10 as a method of aligning the conductive pads 12 with conductive contacts 13 (often referred to as "edge alignment"). For this method to properly work, the registration tolerance of the input and output conductive pads 12 of the ceramic module 10 with respect to the edges 14 of the ceramic module 10 must be small enough in relation to the pitch of the conductive pads 12 to provide proper mating between the conductive pads 12 and the conductive contacts 13.

The edge alignment described is simple and effective in most applications. However, with finer pitches between the conductive pads 12, are registration tolerance between the edges 14 of the ceramic module 10 and the conductive pads 12 is too large to provide acceptable alignment between the conductive pads 12 and the conductive contacts 13.

Two approaches have been used to improve the registration tolerance of a ceramic module. The first approach includes grinding the edges of the ceramic module. The edge are ground after a co-firing of the module to achieve better registration between the edges and the pattern of the conductive pads. The second approach includes dividing the co-firing of the module into two stages. The first stage includes co-firing all layers of the ceramic module except the conductive pad layer. The second stage includes co-firing the conductive pads onto the previously fired layers.

Both of the described approaches add extra processing steps. Consequently, both approaches are very expensive.

It is desirable to have an apparatus and method of aligning the conductive pads of a ceramic module with conductive contacts of a socket which does not require expensive process steps to improve the registration of the edges of the ceramic module with respect to the location of the conductive pads. Furthermore, the apparatus and method would not require any other expensive processing steps.

SUMMARY OF THE INVENTION

The present invention includes an apparatus and method for aligning the conductive pads of a ceramic module with contact points of a socket. The apparatus and method are inexpensive and do not require extra processing step in the fabrication of the ceramic module.

A first embodiment of this invention includes a ceramic module testing apparatus. The apparatus includes a ceramic module having a plurality of conductive pads. A plurality of rigid aligners are attached to a subset of the plurality of conductive pads. A socket having apertures and conductive test points receives the ceramic module. The apertures receive the rigid aligners of the ceramic module and align the conductive pads in registration with the plurality of conductive test points.

A second embodiment of this invention is similar to the first embodiment but includes the rigid aligners being rigid spheres.

A third embodiment of this invention is a method of aligning conductive pads of a ceramic module with contact points of a socket. The method includes attaching rigid spheres to some of the conductive pads. The ceramic module is placed in the socket aligning the rigid spheres with apertures located in the socket. The ceramic module is forced towards the socket so that the rigid sphere are received by the apertures and conductive pads of the ceramic module align and make physical contact with the conductive test points.

Other aspects and advantages of the present invention will become apparent from the following detailed description, taken in conjunction with the accompanying drawings, illustrating by way of example the principles of the invention.

BRIEF DESCRIPTION OF THE DRAWINGS

FIG. 1 shows a ceramic module according to the prior art.

FIG. 2 shows a ceramic module and a receiving socket according to the prior art.

DETAILED DESCRIPTION

Figure 3:
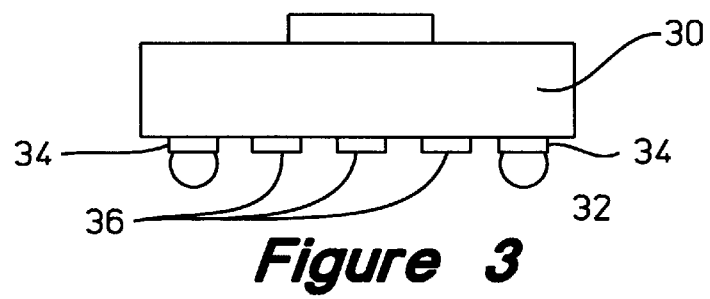
FIG. 3 shows a ceramic module with rigid spheres formed on some of the conductive pads of the ceramic module.

As shown in the drawings for purposes of illustration, the invention is embodied in an apparatus and method for aligning conductive pads of a ceramic module with conductive contact pads of a test socket. Rigid spheres are attached to some of the conductive pads. The spheres act as tooling pins when mated with matching holes provided on the test socket.

FIG. 3 shows a ceramic module 30 in which rigid spheres 32 are formed on conductive pads 34 located on the ceramic module 30. Conductive pads 36 which are to be electrically connected to a test socket are left bare.

The rigid spheres 32 are typically formed from a conductive metal. Generally, this is solder which is formed like a solder bump. However, other types of materials may be used as long as the spheres 32 maintain a rigid structure. Forming the rigid spheres from solder offers the benefit that reflowing the solder results in direct self-alignment of the spheres on the conductive pads. Typically, the rigid sphere attachment occurs during normal process flow and the cost in minimal. The sphere diameter can typically be controlled to within 1 thousandths of an inch.

Formation of the ceramic module 30 requires extra conductive pads 34 for the rigid spheres. However, the conductive pads 34 are formed the same way as the conductive pads 36 required for electrical contact with the socket. Therefore, formation of the extra conductive pads 34 requires no extra cost and processing.

Figure 4:
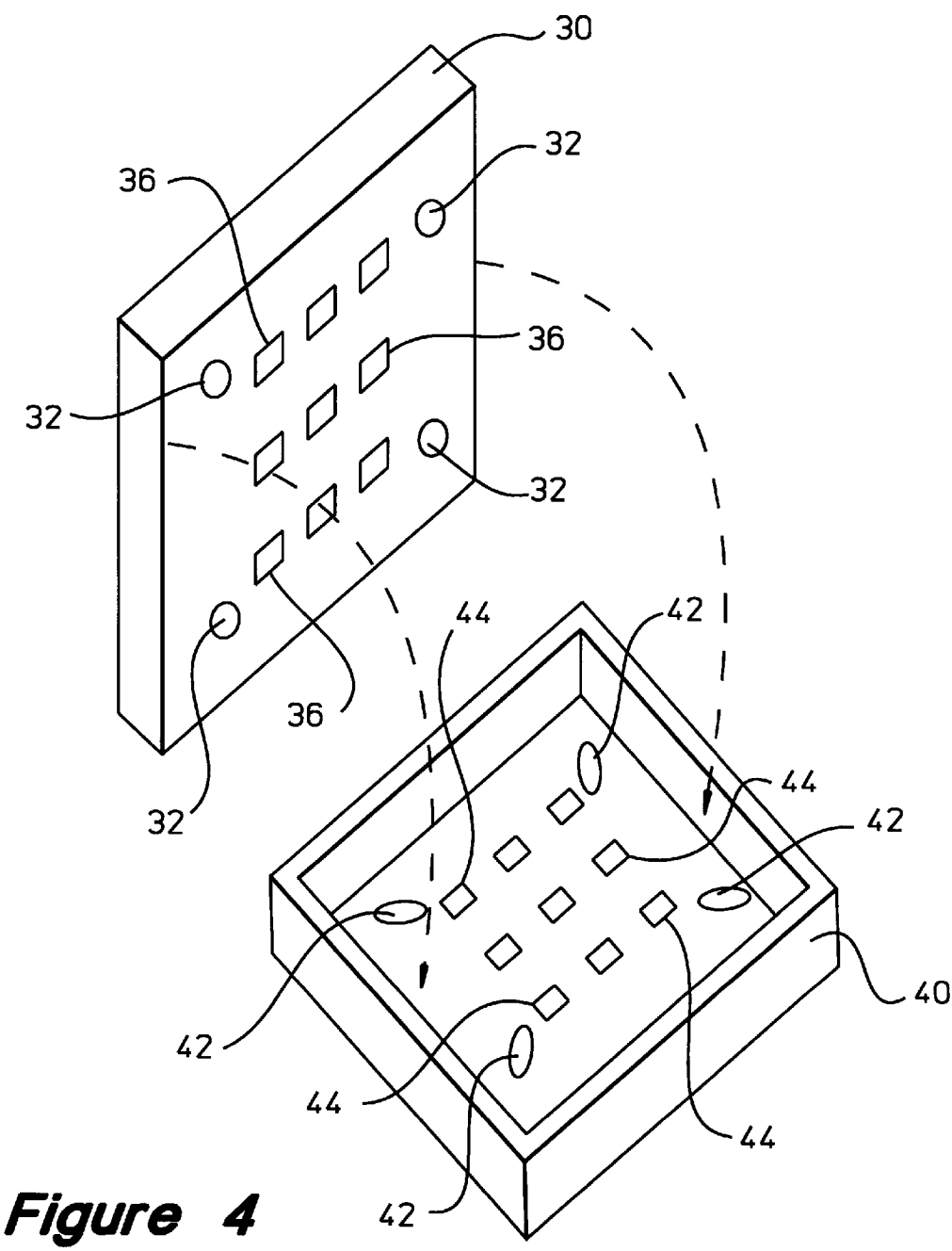
FIG. 4 shows an embodiment of the invention.

FIG. 4 shows an embodiment of the invention. The ceramic module 30 shown in FIG. 3 is mated with a corresponding socket 40. The socket 40 includes apertures 42 which receive the rigid spheres 32 of the ceramic module 30. Mating of the rigid spheres 32 with the apertures 42 aligns the conductive pads 36 with conductive contacts 44 of the socket 40. The alignment of the ceramic module 30 with the socket 40 does not place requirements on the registration tolerance between the edges of the ceramic module 30 and the conductive pads of the ceramic module.

FIG. 4 shows a ceramic module. However, the invention is not limited to ceramic modules only. Bare integrate circuit chips and package components are examples of other types of packages which can be electrically connected to a socket by way of the invention.

The precision of the alignment between the ceramic module 30 and the socket 40 is limited by the precision of the placement of the conductive pads 34, 36 on the ceramic module 30. Typically, the placement precision of the conductive pads 34, 36 is plus or minus 0.05% of the overall dimensions of the module. This is substantially better than the precision typically realized between the edges of the ceramic module 30 and the conductive pads 36. Furthermore, the extra pads 34 and the rigid spheres 32 can be formed at a negligible cost.

The apertures 42 are typically elongated in the direction of the geometric center of the ceramic module 30. Variations of the placement of the conductive pads 34, 36 of the ceramic module 30 tend to occur in the direction of the geometric center of the ceramic module. Therefore, elongation of the apertures in this direction helps ensure an accurate mating between the conductive pads 36 and the contact points 44.

Alternately, the rigid spheres are replaced with micro-pins which could be brazed to conductive pads and used for alignment. However, spheres provide a form factor which is more stable against bending or deflection which can occur during handling. Spheres also provide the lowest constraint during the insertion operation.

Although specific embodiments of the invention have been described and illustrated, the invention is not to be limited to the specific forms or arrangements of parts so described and illustrated. The invention is limited only by the claims.

What is claimed is:

1. A module mounting apparatus comprising:
    a module having a plurality of conductive pads;
    a plurality of rigid aligners attached to a subset of the plurality of conductive pads;
    a socket having apertures and conductive test points, the apertures for receiving the rigid aligners of the module and aligning the conductive pads in registration with the plurality of conductive test points.

2. The module mounting apparatus as recited in claim 1, wherein the rigid aligners are spheres.

3. The module mounting apparatus as recited in claim 2, wherein the spheres comprise a conductive metal.

4. The module mounting apparatus as recited in claim 1, wherein the rigid aligners are solder bumps.

5. The module mounting apparatus as recited in claim 4, wherein the solder bumps comprise a reflowable solder.

6. The module mounting apparatus as recited in claim 1, wherein the apertures are elongated in the direction of the geometric center of the module.

7. A method of aligning conductive pads of a module with contact points of a socket, the method comprising:
    a. attaching rigid spheres to a subset of the conductive pads;
    b. placing the module in the socket aligning the rigid spheres with apertures located in the socket; and
    c. forcing the module towards the socket so that the rigid spheres are received by the apertures and conductive pads of the module align and make physical contact with the conductive test points.

* * * * *